(12) United States Patent
Lopez et al.

(10) Patent No.: US 6,904,326 B2
(45) Date of Patent: Jun. 7, 2005

(54) LIGHT RESPONSIVE DATA ENTRY SYSTEM

(75) Inventors: Matthew G. Lopez, Escondido, CA (US); Gareth R. Kelly, San Diego, CA (US)

(73) Assignee: Hewlett-Packard Development Company, LP., Houston, TX (US)

(*) Notice: Subject to any disclaimer, the term of this patent is extended or adjusted under 35 U.S.C. 154(b) by 274 days.

(21) Appl. No.: 10/273,080

(22) Filed: Oct. 17, 2002

(65) Prior Publication Data

US 2004/0078102 A1 Apr. 22, 2004

(51) Int. Cl.[7] .............................. G05B 15/00; G06F 3/02
(52) U.S. Cl. ........................ 700/84; 250/221; 345/175
(58) Field of Search ............................ 700/84; 250/221, 250/578.1, 227.22; 340/825.19, 815.42, 815.55; 341/20–22, 13, 31; 708/141–143; 345/168, 170, 175, 176

(56) References Cited

U.S. PATENT DOCUMENTS

| | | | | |
|---|---|---|---|---|
| 4,329,581 A | * | 5/1982 | Helfrich et al. | 250/221 |
| 4,387,367 A | * | 6/1983 | Fisher | 341/31 |
| 4,555,731 A | * | 11/1985 | Zinchuk | 348/217.1 |
| 4,564,845 A | * | 1/1986 | Lambie | 346/17 |
| 4,713,535 A | * | 12/1987 | Rhoades | 250/221 |
| 4,905,033 A | * | 2/1990 | Ishida et al. | 396/96 |
| 4,937,443 A | * | 6/1990 | Smoot | 250/221 |
| 4,990,901 A | * | 2/1991 | Beiswenger | 345/175 |
| 5,103,085 A | * | 4/1992 | Zimmerman | 250/221 |
| 5,159,191 A | * | 10/1992 | Mankovitz | 250/229 |
| 5,302,948 A | * | 4/1994 | Lau et al. | 341/31 |
| 5,347,275 A | * | 9/1994 | Lau | 341/20 |
| 5,355,222 A | * | 10/1994 | Heller et al. | 356/610 |
| 5,579,035 A | * | 11/1996 | Beiswenger | 345/169 |
| 5,627,379 A | * | 5/1997 | Bortolini | 250/551 |
| 5,977,878 A | * | 11/1999 | Lang | 340/815.4 |
| 6,097,373 A | * | 8/2000 | Jakobs | 345/168 |
| 6,166,371 A | * | 12/2000 | Milbrath et al. | 250/221 |
| 6,294,305 B1 | * | 9/2001 | Kobayashi et al. | 430/122 |
| 6,299,329 B1 | | 10/2001 | Mui et al. | 362/227 |
| 6,330,082 B1 | | 12/2001 | Oliver | 358/473 |
| 6,355,937 B2 | * | 3/2002 | Antonelli et al. | 250/556 |
| 6,495,832 B1 | * | 12/2002 | Kirby | 250/341.7 |
| 6,504,143 B2 | * | 1/2003 | Koops et al. | 250/221 |
| 6,621,063 B2 | * | 9/2003 | McQueen | 250/208.1 |
| 6,642,506 B1 | * | 11/2003 | Nahum et al. | 250/231.13 |

* cited by examiner

Primary Examiner—Maria N. Von Buhr

(57) ABSTRACT

Systems, methods and devices are provided for a light responsive data entry system. The light responsive data entry system includes a panel. The panel includes a number of data entry areas for transmitting light incident on a surface of the panel to a sensor. The sensor includes an array of light responsive areas with a number of optical conductors. The optical conductors extend between the panel and the sensor. The sensor is capable of generating output signals representative of the light on said light responsive areas.

26 Claims, 3 Drawing Sheets

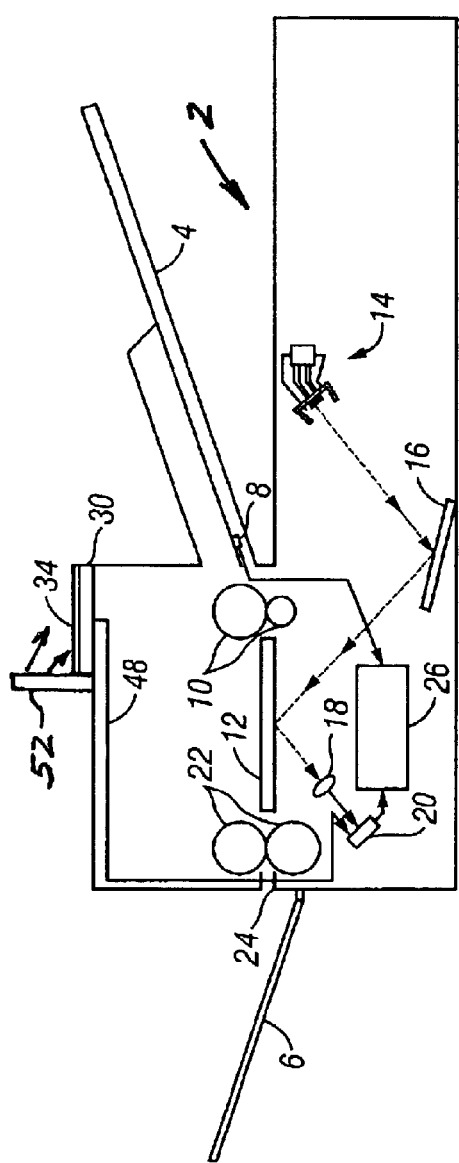
FIG. 1
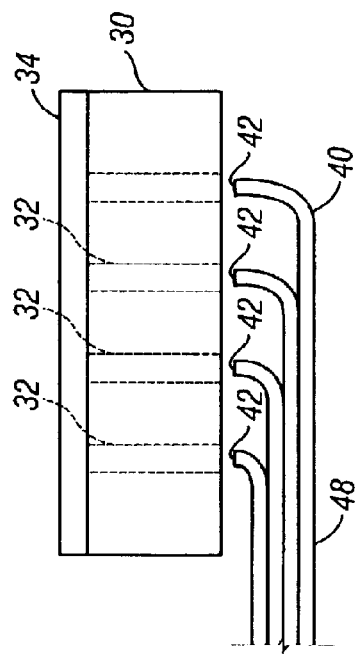
FIG. 2
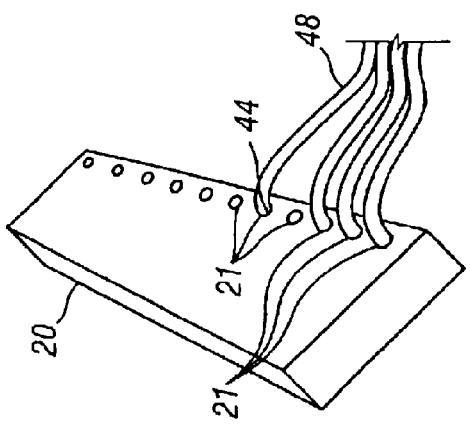

LIGHT RESPONSIVE DATA ENTRY SYSTEM

BACKGROUND

Various home and workplace mechanical units such as printers, scanners, facsimile machines, document copiers and units which combine various of these and other functions, as well as many other types of equipment including machinery, automotive and equipment for various purposes, require a data entry keypad for controlling the equipment. These keypads include moveable buttons and bars which are expensive to construct. A reliable and less expensive data entry keypad is therefore desired.

SUMMARY

Disclosed herein is a data entry system comprising a panel having a plurality of data entry areas for transmitting light incident on a surface of said panel to a sensor having an array of light responsive areas thereon through a plurality of optical conductors extending between said panel and said sensor, said sensor being capable of generating output signals representative of incidence of light on said light responsive areas.

BRIEF DESCRIPTION OF THE DRAWINGS

FIG. 1 is a schematic side elevation view of a document scanner having a stationary light sensor.

FIG. 2 is a schematic side elevation view of a portion of FIG. 1

DETAILED DESCRIPTION OF THE PREFERRED EMBODIMENTS

Figure 3:
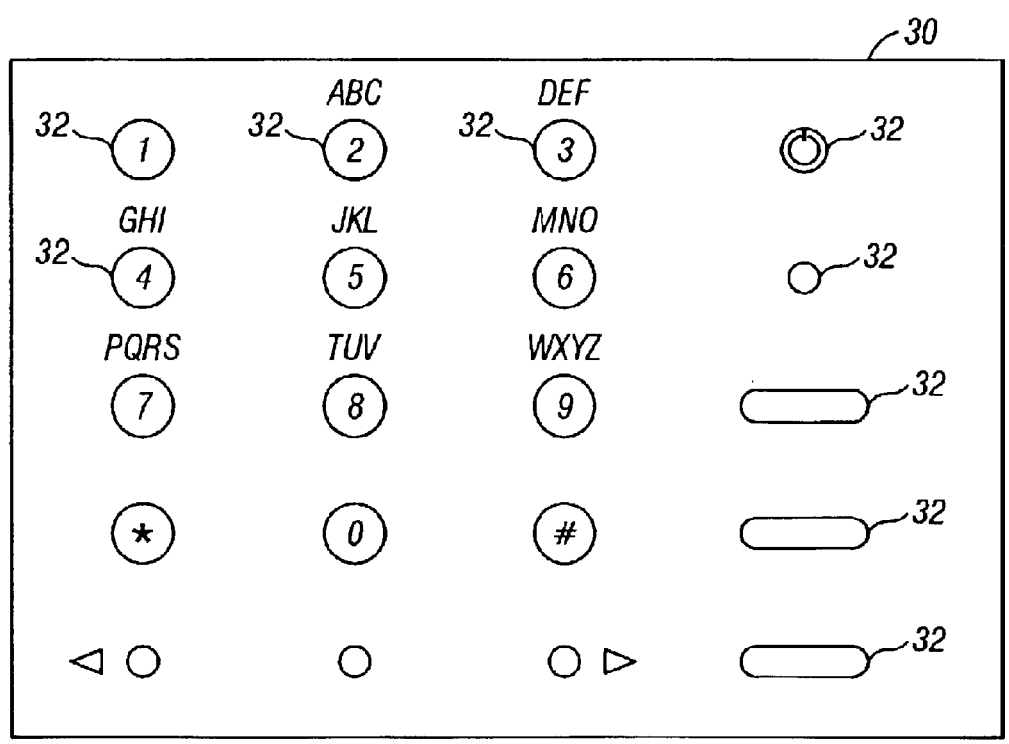
FIG. 3 is a plan view of the keypad seen in FIG. 1.

Embodiments of the present invention relate to a data entry system which is useful in various office equipment including, but not limited to, document handling equipment such as printers, scanners, facsimile machines, document copiers and units which combine various of these functions. Embodiments of the invention will be described in the context of a document scanner but the details and concepts disclosed herein are broadly applicable to a much wider variety of equipment.

FIG. 1 depicts a simplified side elevation of a scanner in which the document to be scanned, which may comprise a sheet of printed media, follows a straight-through path in the scanner 2 from an input device 4, which may comprise an inclined tray or an automatic single sheet feeder to an output tray 6. A sensor 8 detects the presence of a media sheet loaded in the input device 4. In response to the detection of printed media, pick-up rollers 10 pull the media onto a transparent surface 12 which supports the media sheet during scanning of the image(s) printed thereon. An illumination source 14, which may comprise an array of different colored LEDs or a fluorescent lamp, directs light onto a mirror 16 which in turn reflects the light onto the media as it moves over the transparent surface 12. A lens 18 focuses light reflected from the surface of the media onto an optical sensor 20 which may comprise an array of charge coupled devices (CCD) or charge image sensors (CIS). The sensor 20 senses the image formed from the light reflected off the surface of the printed media in order to generate electrical signals representing the image on the surface of the printed media, these signal in turn being fed to a storage device 26 which stores digital data representative of the scanned image. After the sheet is scanned, it is grasped and moved to the output device 6 by suitable means such as opposed rollers 22, 24.

The data entry keypad 30 seen in enlarged elevation view in FIG. 2 and in plan view in FIG. 3 is comprised of an array of light transmitting key areas 32 which may be used for alphanumeric data entry, for turning the equipment on and off or for other control functions. The key areas may be arranged in any suitable configuration such as a rectangular pattern as shown in FIG. 3 and any desired number of key areas 32 may be provided. The panel 30 is preferably fabricated of plastic or lightweight metal with apertures at the key areas 32. A translucent or transparent cover layer 34 of plastic or glass may be bonded to the panel 30 to cover the key areas 32 for protection from the ingress of dirt and other foreign materials. The data entry keypad 30 may alternatively comprise a LCD display having translucent or transparent key areas in a polarizable panel. Such LCD panels may normally be opaque and selected areas thereon may be polarized to translucent or transparent when desired. These properties of LCD displays are particularly useful to display desired user interface information on key areas 32 and non-key areas of the keypad 30 of a multi-function unit such as a facsimile/copier/printer.

Light incident on the cover layer 34, which may be ambient or from a provided separate source, described below, is transmitted through each of the key areas 32 to an associated optical conductor or light pipe 40 having an input end 42 positioned in light transmitting proximity to the inner surface of the respective key area 32 and an output end 44 positioned to direct ambient light transmitted from the key areas 32 onto selected data entry locations 21 on the light receptive surface of the optical sensor 20. Those skilled in the art will understand that the optical sensor 20 includes an adequate number of light responsive areas for receiving the scanned image as well. Interruption, or reduction of the incident light detected by the sensor 20 is caused by coverage of the chosen key areas 32 with fingers or other objects during entry of data. Thus, entered data is transmitted to the storage device 26 by output signals provided by the optical sensor in response to detected reductions in the incident light ordinarily transmitted by the light pipes 40. The routing of the light pipes 40 from the keyboard 30 to the optical sensor panel 20, may be done in alternative ways, although it may be desirable to reduce the length, vibration and bending of the pipes 40. FIG. 1 schematically shows routing of a bundle 48 of light pipes 40. The use of an inexpensive keypad 30 having light transmitting key areas 32 and optical conductors or light pipes 40 to transmit incident light to the existing CCD/CIS array of the optical sensor 20 which is then useful for data entry purposes is a cost effective and significantly advantageous concept particularly for low end document handling equipment such as scanners.

Figure 4:
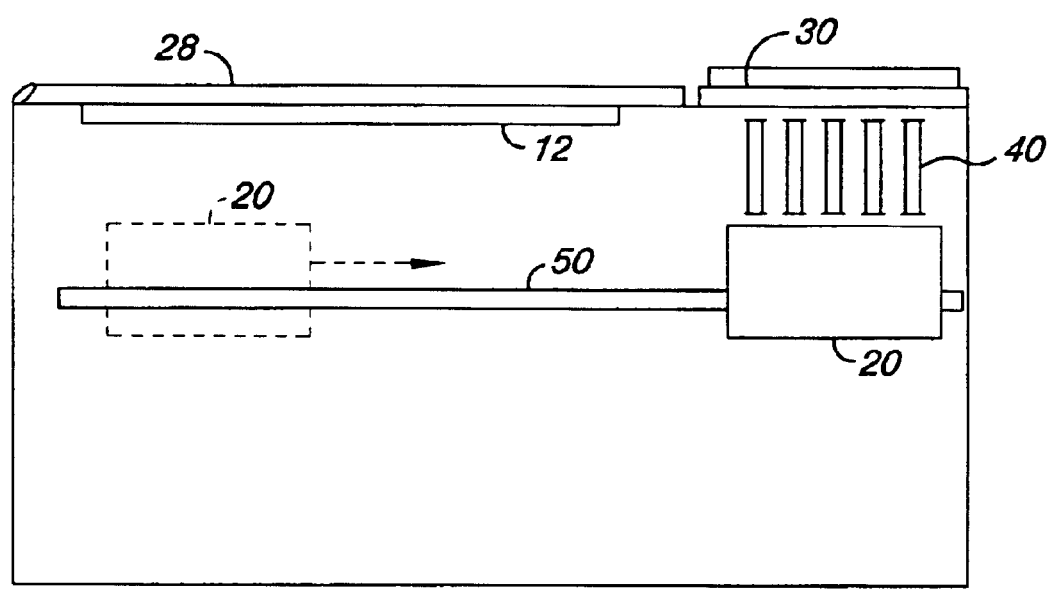
FIG. 4 is a schematic side elevation view of a document scanner having a moveable light sensor.

The data entry keypad 30 and light conductors 40 can easily also be used in scanners of the type shown in FIG. 4 which have a manually moveable lid 28 to hold down a media sheet placed on the transparent surface 12. This form of scanner holds the document in a stationary position during scanning and uses a moveable scanner bar incorporating the optical sensor array 20. The scanner bar and sensor 20 is mounted in any suitable manner such as on spaced guides 50 and may be parked proximate the keypad 30 near the light discharge ends 44 of the light conductors 40 when data is entered.

Since ambient light conditions vary from place to place and at different times of the day, a source 52 of supplemental light may be provided for an essentially constant amount of illumination to the data entry side of the keyboard 30 during data entry. The light source 52 can be automatically actuated in any suitable fashion, such, for example, as when the lid 28 is opened or the machine is switched on. The source 52 may comprise an individual light or lights or suitable optical conduit (not shown) for conducting light from an existing source of illumination in the apparatus such as the source 14 seen in FIG. 1 to illuminate the outer surface of the keypad 30. The source may comprise, for example, a side illuminated LCD screen.

Persons skilled in the art will also appreciate that various modifications can be made from the specific embodiments shown and described above.

What is claimed is:

1. A data entry system comprising:
   a panel having a plurality of data entry areas for transmitting light incident on a surface of said panel; and
   a mobile optical sensor array having an array of light responsive areas thereon that operatively aligns with a plurality of optical conductors extending between said panel and said mobile optical sensor when the mobile optical sensor moves from a non-parked position into a parked position, said mobile optical sensor being capable of generating output signals representative of incidence of light on said light responsive areas.

2. The data entry system of claim 1, wherein said panel has a light transmissive cover on a first surface of said panel.

3. The data entry system of claim 2, further comprising a light source for illuminating said first surface.

4. The data entry system of claim 1, wherein said plurality of optical conductors includes a plurality of light pipes.

5. The data entry system of claim 1, wherein said data entry areas are arranged in a rectangular pattern on said panel.

6. A document processing apparatus comprising:
   a mobile optical sensor having light responsive areas for receiving light; and
   a panel to enter alphanumeric data to control said document processing apparatus, said panel having a plurality of light transmitting areas for data entry and a plurality of optical conduits extending from said light transmitting areas on a first side of said panel to guide said light from said light transmitting areas onto said light responsive areas when the mobile optical sensor is moved into an operative position relative to the ends of the optical conduits remote from the panel, entry of said alphanumeric data being provided by reduction of said light transmitted to ones of said light responsive areas.

7. The apparatus of claim 6, further comprising a light source for illuminating said areas.

8. The apparatus of claim 7, wherein said light source illuminates said light transmitting areas from said first side of said panel.

9. The apparatus of claim 6, wherein data entry is entered by selectively reducing said light transmitted through said light transmitting areas from said first side of said panel to a second side of said panel.

10. The apparatus of claim 9, wherein said light is ambient light.

11. The apparatus of claim 9, further comprising a light source for illuminating said areas on said first side of said panel.

12. The apparatus of claim 6, wherein said light responsive areas are charge coupled devices.

13. The apparatus of claim 6, wherein said light responsive areas are charge image sensors.

14. A method of transmitting information to light responsive areas comprising:
   temporarily aligning the light responsive areas with light conductors;
   transmitting light through a plurality of transparent areas along light conductors onto ones of said light responsive areas; and
   intermittently reducing transmission of said light through selected ones of said transparent areas.

15. The method of claim 14, wherein said light transmission is intermittently reduced by manual contact with said selected ones of said transparent areas.

16. The method of claim 15, wherein said light is ambient light.

17. The method of claim 15, further comprising illuminating said transparent areas with said light using a light source.

18. A document processing system comprising:
   a panel having a plurality of data entry areas for transmitting light incident on a surface of said panel through said data entry areas and an optical conductor extending therefrom; and
   a mobile optical sensor having a plurality of light responsive elements for receiving light, where the mobile optical sensor is moveable into and out of operative position relative the optical conductor extending from the panel.

19. The system of claim 18, wherein said light responsive elements are charge coupled devices.

20. The system of claim 18, wherein said light responsive elements are charge image sensors.

21. The system of claim 18, comprising a document scanner.

22. The system of claim 18, comprising a means for forming an image on media.

23. A system controller comprising:
   a control panel having a plurality of light transmissive data entry areas;
   a plurality of light responsive means moveable relative to the panel for receiving system control information and for generating system control signals; and
   means for conducting light transmitted through respective ones of said areas to respective ones of said plurality of light responsive means.

24. The controller of claim 23, wherein said light responsive means are moveable into and out of operative position relative to ends of said means for conducting light remote from said panel.

25. The controller of claim 23, wherein said light responsive means are charge coupled devices.

26. The controller of claim 23, wherein said light responsive means are charge image sensors.

* * * * *